United States Patent
Gal et al.

(10) Patent No.: US 10,860,052 B2
(45) Date of Patent: Dec. 8, 2020

(54) HYBRID SINGLE LOOP FEEDBACK RETIMING CIRCUIT

(71) Applicant: California Institute of Technology, Pasadena, CA (US)

(72) Inventors: Matan Gal, Pasadena, CA (US); Seyed Ali Hajimiri, La Canada, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/247,494

(22) Filed: Jan. 14, 2019

(65) Prior Publication Data

US 2019/0220055 A1    Jul. 18, 2019

Related U.S. Application Data

(60) Provisional application No. 62/616,947, filed on Jan. 12, 2018.

(51) Int. Cl.
| | |
|---|---|
| *G06F 1/10* | (2006.01) |
| *H03L 7/08* | (2006.01) |
| *H03L 7/097* | (2006.01) |
| *H03L 7/083* | (2006.01) |

(52) U.S. Cl.
CPC ............ *G06F 1/10* (2013.01); *H03L 7/083* (2013.01); *H03L 7/0805* (2013.01); *H03L 7/097* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 6,049,239 | A | * | 4/2000 | Eto ........................... | G06F 1/10 327/158 |
| 6,066,969 | A | * | 5/2000 | Kawasaki ............. | H03L 7/0814 327/156 |
| 6,101,197 | A | * | 8/2000 | Keeth ....................... | G06F 1/10 370/503 |
| 6,845,459 | B2 | * | 1/2005 | Lin .......................... | G06F 1/10 327/147 |
| 6,867,627 | B1 | * | 3/2005 | Murtagh ............... | H03L 7/0812 327/149 |
| 7,072,433 | B2 | * | 7/2006 | Bell ...................... | G11C 7/1066 327/156 |
| 7,078,949 | B2 | * | 7/2006 | Kim ..................... | H03K 5/1565 327/158 |
| 7,471,131 | B2 | * | 12/2008 | Liu ....................... | H03L 7/0814 327/149 |

* cited by examiner

Primary Examiner — An T Luu
(74) Attorney, Agent, or Firm — Alston & Bird LLP

(57) ABSTRACT

A delay locked-loop includes, in part, a phase/frequency detector responsive to a reference clock signal, a charge pump responsive to the phase/frequency detector, a variable delay line responsive to an output of the charge pump to cause a delay in the reference clock signal thereby to generate an internal clock signal, and a controlled delay line that includes a multitude of fixed delay cells. The controlled delay line causes the internal clock signal to be delayed by a delay across one of the multitude of fixed delay cells in response to the output of the charge pump. The controlled delay line generates the output clock signal of the delay-locked loop. The delay locked-loop may further include an overflow detector configured to cause the selection of one of the multitude of fixed delays in response to the output of the charge pump.

29 Claims, 7 Drawing Sheets

HYBRID SINGLE LOOP FEEDBACK RETIMING CIRCUIT

CROSS REFERENCE TO RELATED APPLICATIONS

The present application claims benefit under 35 USC 119(e) of U.S. Application Ser. No. 62/616,947 filed Jan. 12, 2018, the content of which is incorporated herein by reference in its entirety.

FIELD OF THE INVENTION

The present invention is related to retiming circuits, and more particularly, to a delay-locked loop circuit.

BACKGROUND OF THE INVENTION

Phased arrays have experienced monotonic increase in usage since their inception and continue to be extensively employed in radar, sensing, and communication systems. Their directivity, signal-to-noise ratio (SNR), signal-to-interference ratio (SIR), and electronic beam stirring capability improves with increasing number of transmit/receive or antenna elements. Therefore very large-scale phased arrays, sometimes referred to as millions-element arrays, are desirable.

Forming such a large array, however, requires a broad range of architectural and technological improvements, such as scalable structures, and highly-integrated silicon-based radio frequency integrated circuits. In a scalable array transmitter architecture, a relatively low-frequency single reference clock signal is distributed to identical transmit or receive blocks (or tiles) of the array, where a higher frequency clock signal is synthesized, phase-shifted, and amplified from the reference clock signal. The high-frequency clock signal is often generated from the lower frequency signal using a phased locked-loop (PLL) to establish coherence across the entire array.

FIG. 1A shows an array 50 of K×K integrated circuit (IC) phased arrays 10 each receiving the same reference clock signal Ref_Clk as shown. FIG. 1B provides a more detailed view of one of the phased array ICs. PLL 20 disposed in the IC receives the reference clock signal Ref_Clk and in response generates a higher-frequency clock signal Clk that is applied to each of the N transmit elements $30_i$ disposed in the IC. Each transmit element $30_i$ includes, in part, a transmitter $32_i$ and a transmit antenna $34_i$, where i is an index ranging from 1 to N in this example. Although not shown, a phased array receiver often has a similar architecture.

One major challenge with the scalable phased array architecture shown in FIGS. 1A and 1B is maintaining the timing accuracy of the reference clock signal in the distribution process. One clock distribution technique, commonly referred to as a central star distribution technique, is impractical in large arrays as the number of traces and load amount become prohibitive. Another clock distribution technique, commonly referred to as a daisy chained distribution technique, suffers from large timing variations due to variations in the supply voltage, temperature, and the loads. A need continues to exist for an improved clock generation circuit.

BRIEF SUMMARY OF THE INVENTION

A retiming circuit, in accordance with one aspect of the present invention, includes, in part, a delay locked-loop. The delay locked-loop, in accordance with one embodiment of the present invention, includes, in part, a phase/frequency detector responsive to a reference clock signal, a charge pump responsive to the phase/frequency detector, a variable delay line responsive to an output of the charge pump to cause a variable delay in the reference clock signal thereby to generate an internal clock signal, and a controlled delay line that includes a multitude of fixed delay cells. The controlled delay line causes the internal clock signal to be delayed by a delay across one of the multitude of fixed delay cells in response to the output of the charge pump. The controlled delay line generates the output clock signal of the delay locked-loop.

In one embodiment, the variable delay line includes a multitude of variable delay cells coupled in series. Each variable delay cell receives the output of the charge pump to change the delay across variable delay cell. In one embodiment, each variable delay cell is a differential delay cell. In one embodiment, each fixed delay cell is a differential delay cell supplying its output signal to a multiplexer.

In one embodiment, the delay locked-loop further includes, in part, an overflow detector configured to cause the selection of one of the multitude of fixed delays in response to the output of the charge pump. In one embodiment, the overflow detector includes first and second comparators. The first comparator is adapted to detect whether the output voltage of the charge pump is above a first threshold voltage. The said second comparator is adapted to detect whether the output voltage of the charge pump is below a second threshold voltage.

In one embodiment, the delay locked-loop further includes, in part, an up/down counter configured to be incremented if the first comparator detects that the output voltage of the charge pump is above the first threshold voltage. The up/down counter is further configured to be decremented if the second comparator detects that the output voltage of the charge pump is below the second threshold voltage.

In one embodiment, the clock terminal of the up/down counter is responsive to the output signals of the first and second comparators. In one embodiment, the delay locked-loop further includes, an OR logic gate having a first input terminal receiving the output signal of the first comparator and a second terminal receiving the output signal of the second comparator, and a delay element delaying an output signal of the OR logic gate to generate a second internal clock signal applied to a clock terminal of the up/down counter.

In one embodiment, the up/down counter generates a select signal applied to a select input terminal of a multiplexer receiving the multitude of fixed delays of the controlled delay line. In one embodiment, the delay locked-loop further includes, in part, a first reset circuit configured to reset the phase/frequency detector in response to the second internal clock signal.

In one embodiment, the first rest circuit is further configured to reset the phase/frequency detector in response to a logical AND of the reference clock and the output clock signal. In one embodiment, the delay locked-loop further includes, in part, a divider configured to divide the logical AND of the reference clock and the output clock signal and generate a divided clock signal in response. The divider delivers the divided clock signal to a clock terminal of a flip-flop receiving the second internal clock signal at its data input terminal.

In one embodiment, the delay locked-loop further includes, in part, a second reset circuit configured to set the output voltage of the charge pump to a predefined voltage in response to an output of the flip-flop. In one embodiment, the delay locked-loop further includes, in part, a filter coupled to an output of the charge pump. In one embodiment, the filter is a capacitor. In one embodiment, the delay locked-loop further includes, in part, a filter coupled to an input terminal of the first and second comparators.

In one embodiment, the delay locked-loop further includes, in part, a voltage divider supplying a first reference voltage to the first comparator, and a second reference voltage to the second comparator. In one embodiment, each variable delay cell is a differential delay cell that includes, in part, first and second inverters coupled in series and providing a differentially high signal, third and fourth inverters coupled in series and providing a differentially low signal, a first capacitor having a first terminal coupled to an input terminal of the second inverter, and a second terminal coupled to the output of the charge pump, and a second capacitor having a first terminal coupled to an input terminal of the fourth inverter, and a second terminal coupled to the output of the charge pump. In one embodiment, the retiming further includes, in part, a phase locked-loop adapted to receive the output clock signal of the delay-locked loop and generate a second output clock signal in response.

A method of retiming an output clock signal, in accordance with one embodiment of the present invention, includes, in part, detecting the difference between the phase/frequency of the output clock signal and a reference clock signal, increasing or decreasing a voltage in response to the detected difference, causing a variable delay in the reference clock signal thereby to generate an internal clock signal in response to the increase or decrease in the voltage, and causing the internal clock signal to be delayed by a delay across one of a multitude of fixed delay cells in response to the increase or decrease in the voltage, thereby to generate the output clock signal.

In one embodiment, the variable delay is generated by a multitude of variable delay cells coupled in series. In one embodiment, each of the multitude of variable delay cells is a differential delay cell. In one embodiment, each of the fixed delay cells is a differential delay cell supplying its output signal to a multiplexer.

In one embodiment, the method further includes, in part, detecting whether the voltage is above a first threshold voltage to generate a first logic state, and detecting whether the voltage is below a second threshold voltage to generate a second logic state. In one embodiment, the method further includes, in part, incrementing a counter if the voltage is above the first threshold voltage, and decrementing the counter if the voltage is below the second threshold voltage.

In one embodiment, the clock terminal of the counter is responsive to the detection of whether the voltage is above the first threshold voltage and/or whether the voltage is below the second threshold voltage. In one embodiment, the method further includes, in part, ORing the first and second logic states, and delaying the output of the OR function to generate a second internal clock signal applied to a clock terminal of the counter. In one embodiment, the counter generates a select signal selecting one of the multitude of fixed delays. In one embodiment, the method further includes, in part, resetting a phase/frequency detector detecting the difference between the phase/frequency of the output clock signal and the reference clock signal in response to the second internal clock signal. In one embodiment, the method further includes, in part, setting the voltage to a predefined value.

DETAILED DESCRIPTION OF THE INVENTION

In accordance with one embodiment of the present invention, a hybrid single-loop (HSL) delay locked-loop (DLL) circuit generates a clock used in a phased array transmitter, phased array receiver or any other circuit that can benefit from an accurate, low-noise clock characterized by sub-picosecond root mean squared (RMS) jitter. A relatively large portion of the out-of-band phase noise of a DLL, in accordance with embodiments of the present invention, when the DLL is used in a phased array (or any other circuit) that includes an on-chip phase locked-loop (PLL), is rejected by the PLL, thus improving the overall performance of the array.

Figure 2:
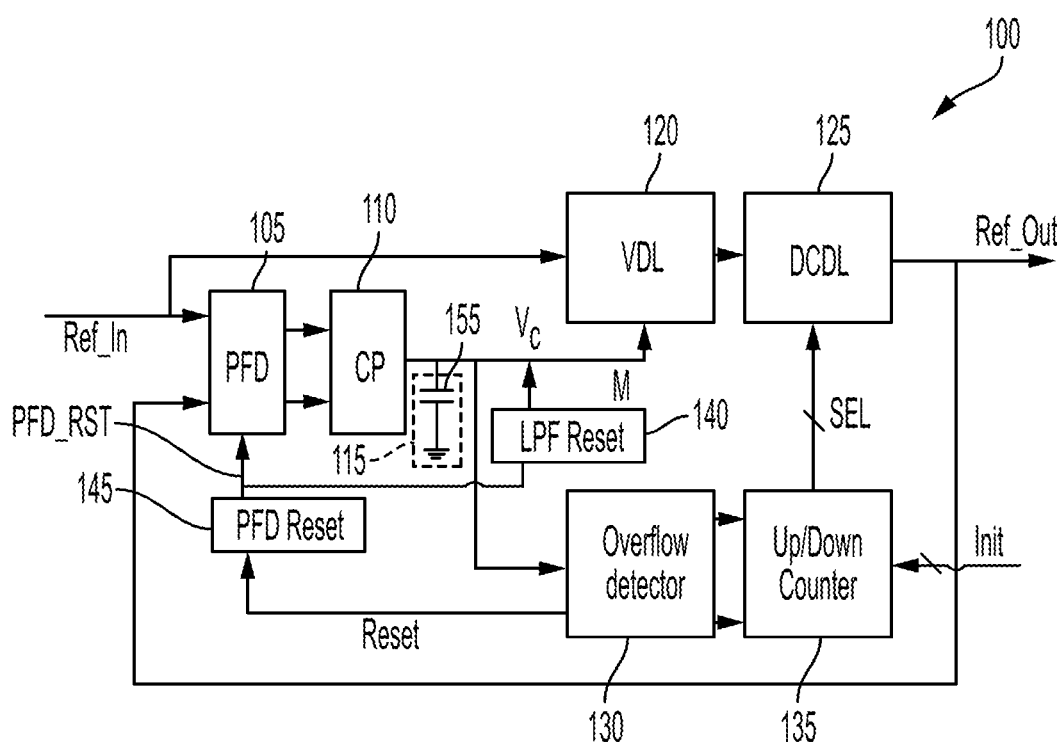
FIG. 2 is a simplified high-level block diagram of a delay locked-loop, in accordance with one embodiment of the present invention.

FIG. 2 is a simplified high-level block diagram of a DLL 100, in accordance with one embodiment of the present invention. DLL 100 is shown as including, in part, a phase/frequency detector (PDF) 105, a charge pump (CP) 110, low-pass filter (LPF) 115, a variable delay line (VDL) 120, a digitally controlled delay line (DCDL) 125, an overflow detector 130, an up/down counter 135, a low-pass filter reset circuit 140, and a phase/frequency detector reset circuit 145. DLL 100 is shown as receiving input reference clock signal Ref_In and generating, in response, an output clock signal Ref_Out that tracks and locks to signal Ref_In, as described below.

As seen from FIG. 2, PFD 105 is adapted to detect the phase or frequency difference between signals Ref_In and Ref_Out and, in response, cause CP 100 to charge or discharge node N, shown as carrying voltage Vc. LPF 115, which is adapted to remove the low-frequency components of the signals present on node N, is shown as including a capacitor 155 disposed between node N and the ground terminal.

The delay across VDL 120, adapted for fine tuning of the delay, is controlled by voltage Vc. If clock Ref_Out leads clock Ref_In in phase, signal Vc causes the delay across VDL 120 to decrease, thereby to facilitate the alignment of the two clock signals and lock signal Ref_Out to signal Ref_In. Conversely, if clock Ref_Out lags clock Ref_In in phase, signal Vc causes the delay across VDL 120 to increase thereby to help lock signal Ref_Out to signal Ref_In.

The delay across DCDL 125, which is used for coarse delay tuning, is controlled by up/down counter 135. DCDL 125 includes a multitude of low-noise fixed-delay elements. An increase in the count of up/down counter 135 results in the selection of a shorter delay across DCDL 125, and hence leads to a shorter delay in signal Ref_Out relative to signal Ref_In. Conversely, a decrease in the count of up/down counter 135 results in the selection of a longer delay across DCDL 125, and hence leads to a longer delay in signal Ref_Out relative to signal Ref_In. Because a DLL, in accordance with one aspect of the present invention, uses both a variable delay line for fine tuning of the delay, and a digitally controlled delay line for coarse tuning of the delay, the DLL of the present invention significantly reduces the noise contribution from a relatively large delay adjustment that would be otherwise required to correct for both negative and positive errors, as is commonly done in conventional DLLs.

Figure 3:
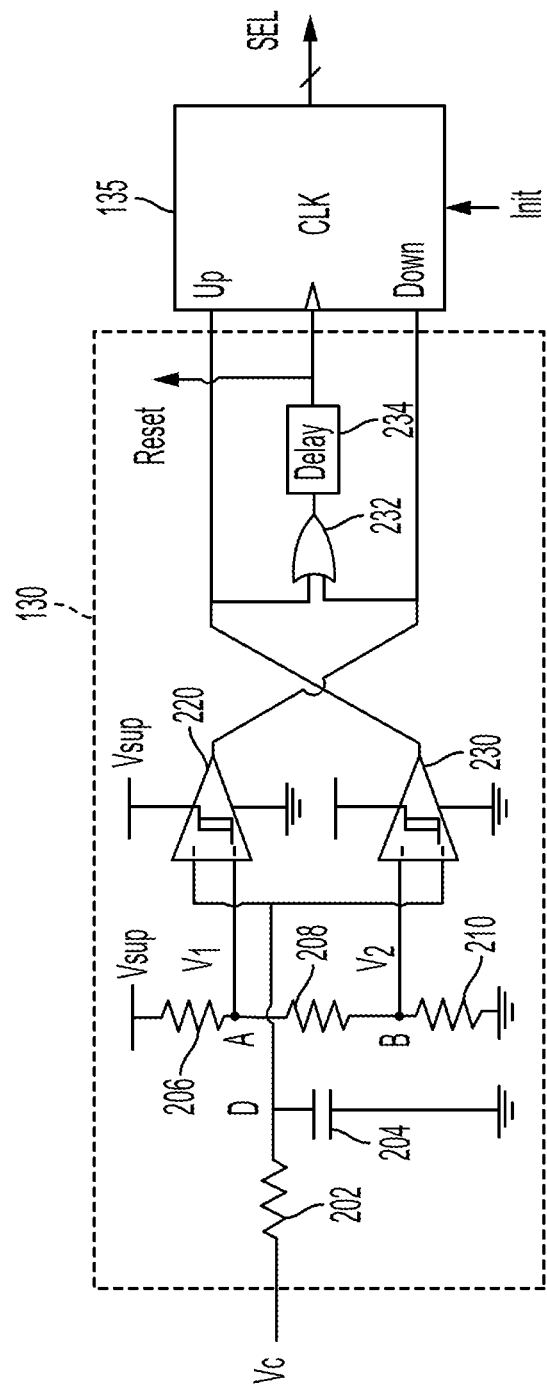
FIG. 3 is a schematic diagram of the overflow detector of FIG. 2, in accordance with one embodiment of the present invention.

The count of up/down counter 135 is increased or decreased by overflow detector 130, which in turn, is controlled by voltage Vc. FIG. 3 is a combined transistor/block level schematic diagram of overflow detector 130 shown as driving up/down counter 135. Overflow detector 130 is shown as including, in part, resistors 202, 206, 208, 210, capacitor 204, comparators 220, 230, OR gate 232 and delay element 234. Overflow detector 130 receives voltage Vc present on node N as shown in FIG. 2 and causes, in part, up/down counter 135's count to increment or decrement, as described further below.

Resistor 202 and capacitor 204 form a low-pass filter to filter out low frequency components of the signal present at node D—shown as being coupled to a first terminal of both comparators 220 and 230. In one embodiment, the low-pass filter formed by resistor 202 and capacitor 204 has a cutoff frequency of approximately 16 MHz.

Resistors 206, 208 and 210 form a voltage divider dividing the supply voltage $V_{sup}$ to generate (i) a first reference voltage $V_1$ at node A coupled to the second terminal of comparator 220, and (ii) a second reference voltage $V_2$ at node B coupled to the second terminal of comparator 230. In one embodiment, supply voltage $V_{sup}$ is 1 volt and the resistances of resistors 206, 208 and 210 are selected such that $V_1$ and $V_2$ are 0.7 volt and 0.3 volt, respectively, thereby to provide sufficient tuning range for VDL 120, and mitigating the noise at CP 110 over a range of Vc values. In order to mitigate Vc ripple, in one embodiment, comparators 220 and 230 are designed to have a 20 mV hysteresis.

The output of comparator 220 is coupled to the Down input terminal of counter 135, thereby causing counter 135's count to decrease if voltage Vc exceeds $V_1$. Similarly, the output of comparator 230 is coupled to the Up input terminal of counter 135, thereby causing counter 135's count to increase if voltage Vc falls below $V_2$. The output signals of comparators 220 and 230 are delivered to OR gate 232 whose output signal is delayed by delay element 234 before it is applied to the input clock signal CLK of up/down counter 135. Up/down counter 135 is loaded with an initial count value using input signal Init. The output signal SEL of up/down counter 135 is applied to DCDL 125 disposed in DLL 100, as described further below.

The delay generated by delay element 234 ensures that the output signals of comparators 220 and 230 are stable before a corresponding transition occurs on clock signal CLK of up/down counter 135. Delay element 234 generates a Reset signal that resets the PFD 105 and lowpass filter 115 of DLL 100 shown in FIG. 2, as described further below.

Figures 4A, 4B:
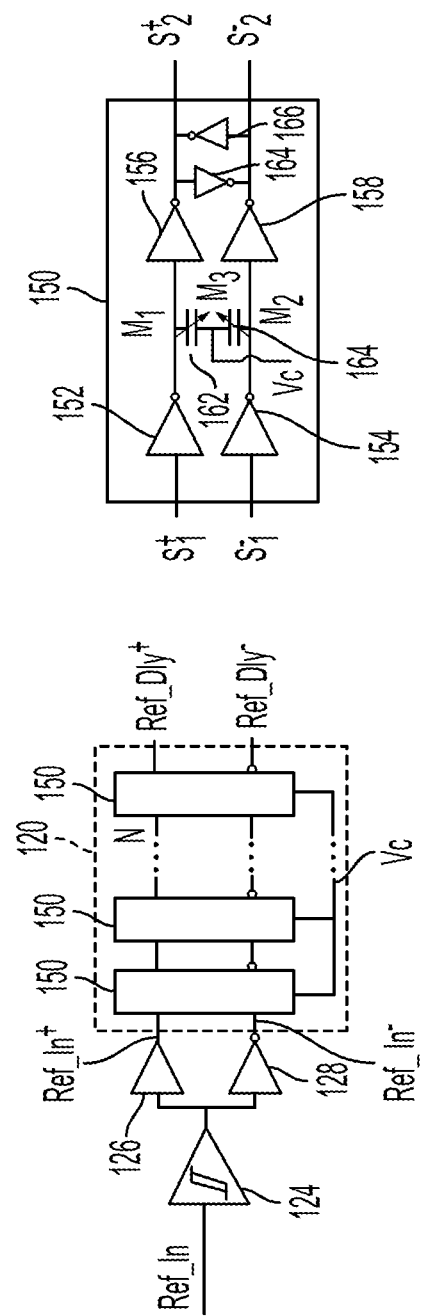
FIG. 4A is a simplified high-level block diagram of the variable delay line of FIG. 2, in accordance with one exemplary embodiment of the present invention.
FIG. 4B is a schematic diagram of a variable delay element disposed in the variable delay line of FIG. 4A, in accordance with one embodiment of the present invention.

FIG. 4A is a simplified high-level block diagram of VDL 120 of FIG. 2, in accordance with one exemplary embodiment of the present invention. VDL 120 is shown as including N variable delay elements 150, where N is an integer greater than or equal to two. In the exemplary embodiment of FIG. 4A, each variable delay element 150 is shown as being a differential variable delay element each receiving a differentially high signal and a differentially low signal. Using differential delay elements, enable the tracking of the falling edge of the output clock signal, thus reducing the minimum required delay by T/2 (i.e., half the clock cycle) and thereby enabling the use of lower reference clock frequencies.

The delay across each variable delay element 150 is controlled by voltage Vc generated by charge pump 110, as shown in FIG. 2. VDL 120 is adapted to cause a delay in signal Ref_In so as to generate a differentially positive delay signal Ref_Dly$^+$ and a differentially negative delay signal Ref_Dly$^-$, which together form a differential pair of delay signals. The delay across VDL 120 is varied in response to voltage Vc, as described further below. Schmitt trigger 124 is adapted to mitigate any noise and/or jitter that may be present on signal Ref_in. Buffer 126 and inverter 128 receive the output signal of Schmitt trigger 124 and generate a pair of differential signals, namely Ref_In+ and Ref_in$^-$ that are 180 out-of-phase and are applied to the first delay element 150 of VDL 120.

FIG. 4B shows a variable delay element 150 as used in VDL 120, in accordance with one embodiment of the present invention. Variable delay element 150 is shown as including, in part, inverters 152, 154, 156, and 158. Disposed between node $M_1$—coupling the output of inverter 152 to the input of inverter 156—and node $M_2$—coupling the output of inverter 154 to the input of inverter 158—are capacitors 162 and 164 sharing a common node $M_3$ to which voltage Vc generated by CP 110 of DLL 100 is applied. Therefore, as the voltage Vc changes, the delay between input signal $S_1^+$ and output signal $S_2^+$, which is the delay across inverters 152, 156 is varied. The change in voltage Vc also causes a similar delay between input signal $S_1^-$ and output signal $S_2^-$, which is the delay across inverters 154, 158. Back-to-back inverters 164 and 166 coupled between the output terminals of inverters 156, 158, are adapted to cause the rise and fall time of signal $S_2^+$ to substantially match those of signal $S_2^-$.

Figures 5A, 5B:
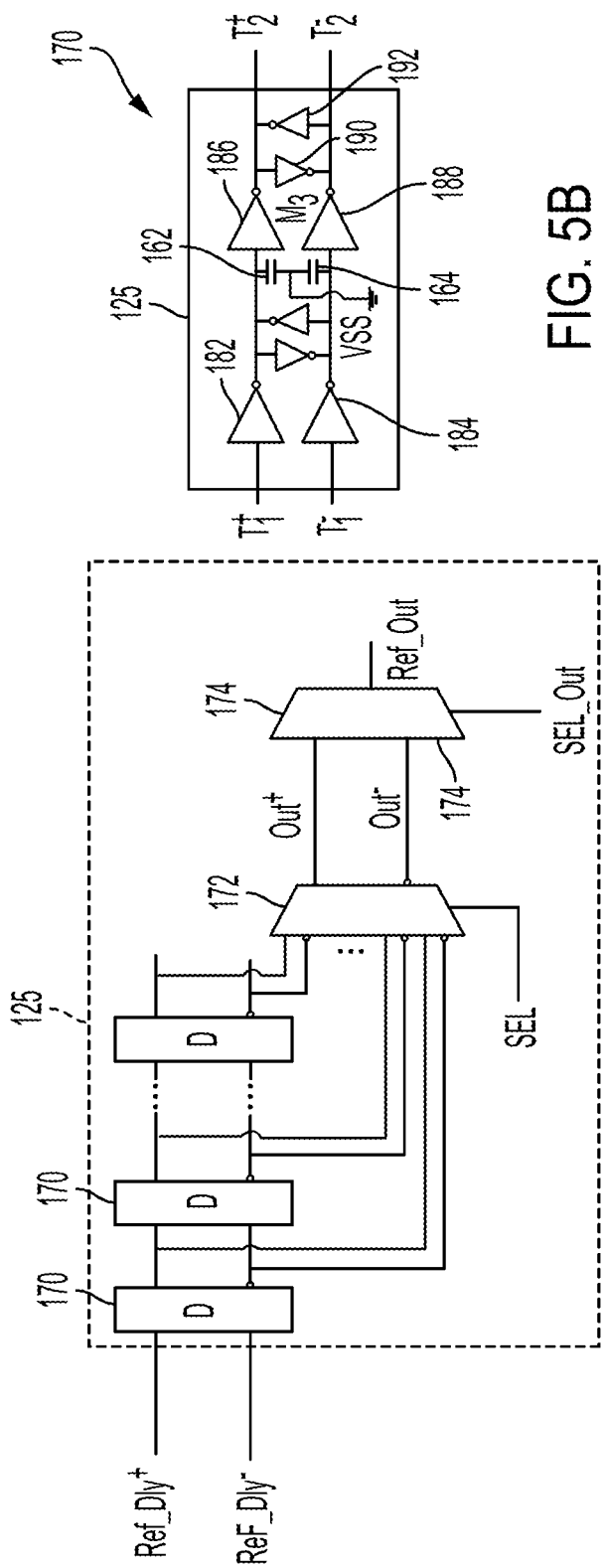
FIG. 5A is a schematic diagram of the digitally controlled delay line of FIG. 2, in accordance with one exemplary embodiment of the present invention.
FIG. 5B is a schematic diagram of a delay element disposed in the digitally controlled delay line of FIG. 5A, in accordance with one embodiment of the present invention.

FIG. 5A is a simplified high-level block diagram of DCDL 125 of FIG. 2, in accordance with one exemplary embodiment of the present invention. DCDL 125 is shown as including M (M is an integer greater than or equal to 2) fixed delay elements 170, and a multiplexer 172. In one embodiment, M may be equal to 6. In the exemplary embodiment of FIG. 4A, each delay element 170 is shown as being a differential delay element each receiving a differentially high signal and a differentially low signal. The differential delay generated by each delay element 170 is applied to multiplexer 172 which receives at its select terminal signal SEL generated by up/down converter 135.

Multiplexer 172 is configured to select, in response to signal SEL, the differential delay signal generated by one of the delay elements 170 and deliver the selected differential delay signal as its output signals Out$^+$ and Out$^-$. Therefore, an increase in the count of up/down counter 135 results in the selection of a smaller delay by multiplexer 172, and a decrease in the count of up/down counter 135 results in the selection of a larger delay by multiplexer 172. Multiplexer 174 is adapted to select one of the signals Out$^+$ and Out$^-$ and deliver the selected signal as signal Ref_Out which is the output signal of DLL 100.

FIG. 5B shows a fixed delay element 170 as used in DCDL 125, in accordance with one embodiment of the present invention. As seen, delay element 170 is similar to delay element 150 shown in FIG. 4B, except that in delay element 170, node $M_3$ that is common to capacitors 162 and 164 is coupled to a fixed supply voltage such as the ground voltage $V_{ss}$.

Figure 6:
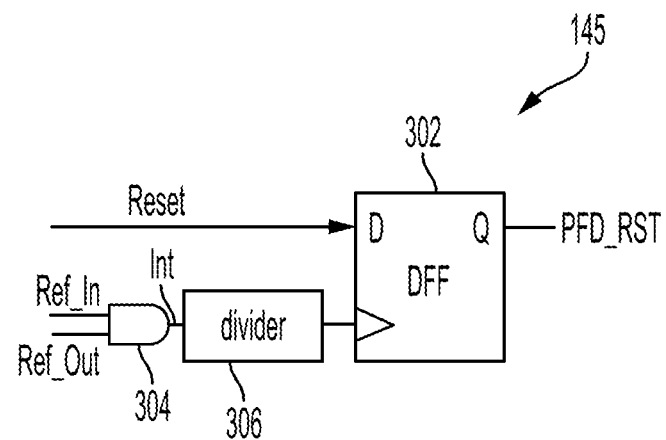
FIG. 6 is a schematic diagram of the phase/frequency detector reset circuit of FIG. 2, in accordance with one embodiment of the present invention.

FIG. 6 is a simplified block diagram of PFD reset circuit 145 of DLL 100 shown in FIG. 2. PFD reset circuit 145 is configured to receive signal Reset generated by overflow detector 130 and generate, in response, signal PFD_RST used to reset PFD 105, as is also shown in FIG. 2. PFD reset circuit 145 is shown as including, in part, a flip-flop 302, an AND gate 304 and a divider 306.

Referring concurrently to FIGS. 2, 3 and 6, when an overflow event occurs, signal Reset, generated by delay element 234 of overflow detector 130, is asserted. Signal Reset is applied to data input terminal of flip-flop 302. In order to restart the tracking of VDL 120 consistently, the reset signal is synchronized with both input clock Ref_In as well as output clock Ref_Out of DLL 100 to ensure that PFD 105 state is reset in a non-ambiguous state. To achieve this, AND gate 304 performs a logical AND operation on input and output clock signals Ref_In and Ref_Out to generate signal Int which is subsequently divided by clock divider 306 and applied to the clock terminal of flip-flop 302. In one embodiment, divider 306 is a divide-by-4 divider to support higher reference frequencies. The output signal PFD_RST of flip-flop 302 is used to reset PFD 105.

Figure 7:
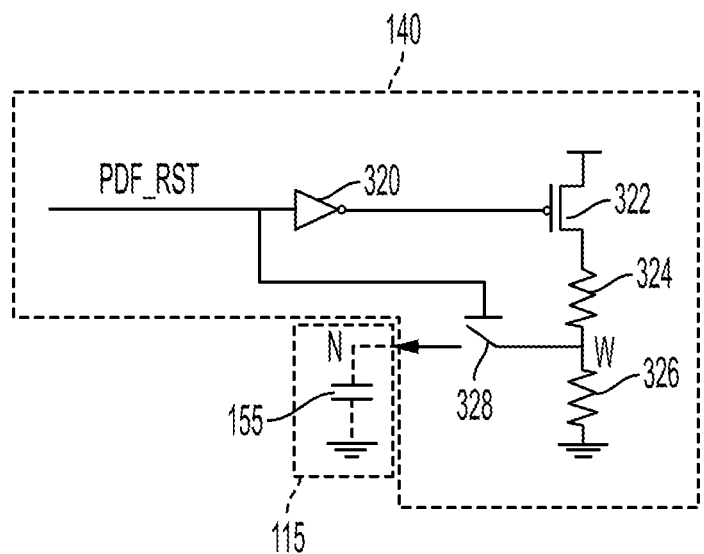
FIG. 7 is a schematic diagram of the filter reset circuit of FIG. 2, in accordance with one embodiment of the present invention.

FIG. 7 is a simplified schematic diagram of LPF reset circuit 140, in accordance with one exemplary embodiment of the present invention, used to reset LPF 115. LPF reset circuit 140 is shown as including, in part, an inverter 320, a PMOS transistor 320 and a resistor divider circuit that includes resistors 324 and 326. When signal PFD_RST (see FIG. 6) is asserted, transistor 325 turns on thereby causing current to flow through resistor 324 and 326 and set the voltage at node W to a predefined voltage. The assertion of signal PFD_RST also causes switch 328 to close thus coupling the voltage at node W to the first terminal (node N) of capacitor 155 disposed in LPF 115.

In one embodiment, resistors 324 and 326 have similar resistance thus causing the voltage at node M to be substantially half the supply voltage $V_{sup}$. Therefore, in such embodiments, the voltage across capacitor 155 is set to substantially half the supply voltage during each reset. Furthermore, as described above, any change in counter 135's count causes a reset of PFD 105, as well as a reset of voltage Vc of LPF 115 to a mid supply voltage.

Referring to FIGS. 2 and 3, in order to achieve a lock, up/down counter 135 is set to an initial value (thereby selecting a predefined delay from DCDL 125) via signal Init. Thereafter, DLL 100 continuously tracks Ref_In by varying the delay generated by VDL 120. If the delay required for the lock is unattainable by VDL 120 alone, such as when voltage Vc is either greater than the trip point (e.g., 0.7 volts) of comparator 220 or smaller than the trip point (e.g., 0.3 volts) of comparator 230, counter 135 is either incremented or decremented to select a different delay from DCDL 125, subsequent to which VDL 120 tracking continues. Since this corresponds to a first order control loop, overshoots are mitigated and stability is guaranteed.

A DLL, as described above in accordance with embodiments of the present invention, is robust and does not require either lock detect indication or synchronizing between separate control loops. It provides a number of advantages when used in phased arrays that typically require tracking of a slowly varying reference signal, and for which the initial lock time is not a major consideration. Furthermore, a DLL, as described above in accordance with embodiments of the present invention, can achieve a lock within a few clock cycles based on a priory estimate of the DCDL delay steps value.

Figure 8A:
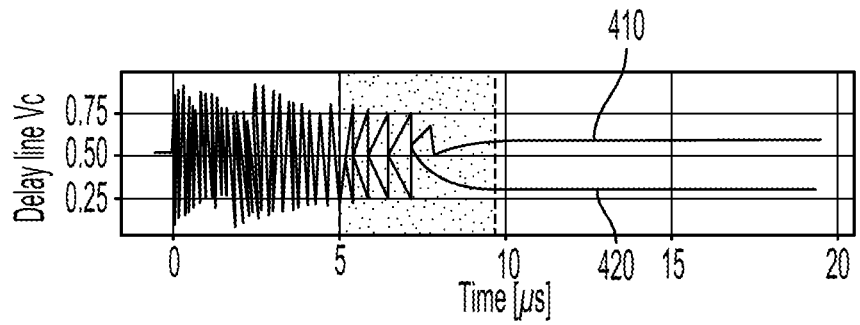
FIGS. 8A-8C are simulation timing diagrams of a number of signals of the delay locked-loop of FIG. 2, in accordance with one embodiment of the present invention.

FIG. 8A is an exemplary computer simulation of DLL 100. Plots 410 shows the voltage Vc as a function time when the DLL achieves a lock by decrementing the up/down counter, and plot 420 shows the voltage Vc as a function time when the DLL achieves a lock by incrementing the up/down counter. As is seen from both plots 410 and 420, the control voltage Vc overflows and resets until the required delay across the DCDL is selected while fine tuning of the delay across the VDL continues throughout.

Figure 8B:
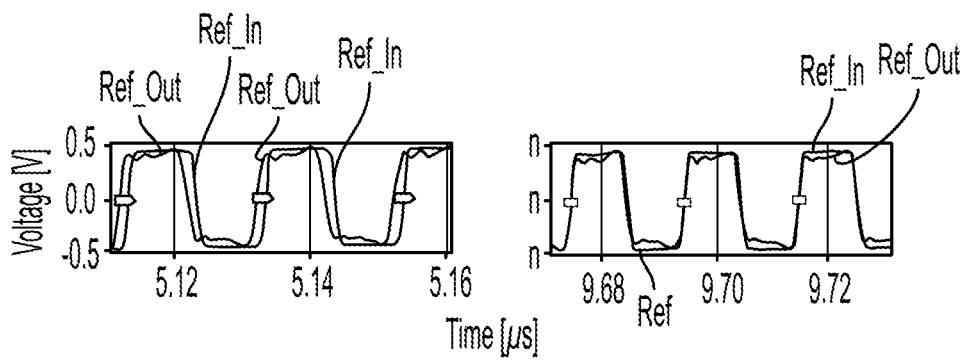

FIG. 8B shows the input reference clock signal Ref_In and the output clock signal Ref_Out of the DLL for the same simulation shown in FIG. 8A. As seen from FIG. 8B, signal Ref_In leads signal Ref_Out between the simulation times 5.10 µsec and 5.16 µsec and therefore no locking is attained. This may also be seen from FIG. 8A where the up/down counter is showing as counting up (or down) during the same period. FIG. 8B also shows that signal Ref_Out is locked to signal Ref_In at about 9.67 µsec and thereafter during which the count of the up/down counter is unchanged, as is seen from FIG. 8A.

Figure 8C:
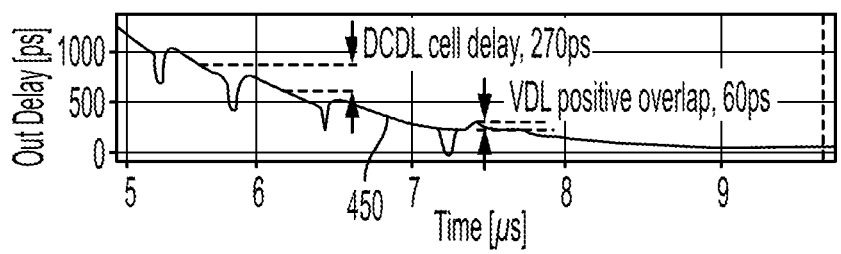

FIG. 8C shows a plot 450 of the delay between signals Ref_In and Ref_Out between simulation times 5 µsec and 10 µsec. It is seen that the delay between these two signals remains substantially unchanged after simulation time of 9 µsec. The delay associated with each fixed delay cell in DCDL in the above simulation is selected to be nearly 270 ps. This delay is either added (or subtracted) from the overall delay across DCDL with each decrement (or increment) of the up/down counter. The delay caused by VDL is shown as being nearly 60 ps between simulation times 7 µsec and 8 µsec. The delay between signals Ref_In and Ref_Out is determined from their respective waveform zero crossing points.

Figure 1A:
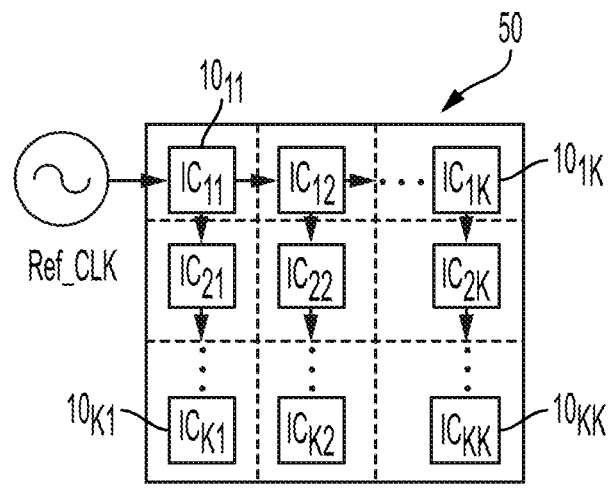
FIG. 1A shows an array of phased array integrated circuits each receiving the same reference clock signal.
Figure 1B:
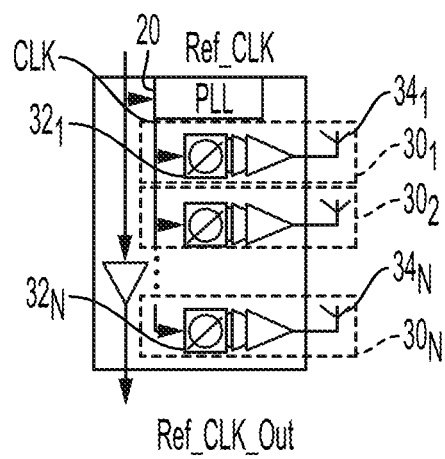
FIG. 1B provides a more detailed view of one of the phased array integrated circuits of FIG. 1A.
Figure 9:
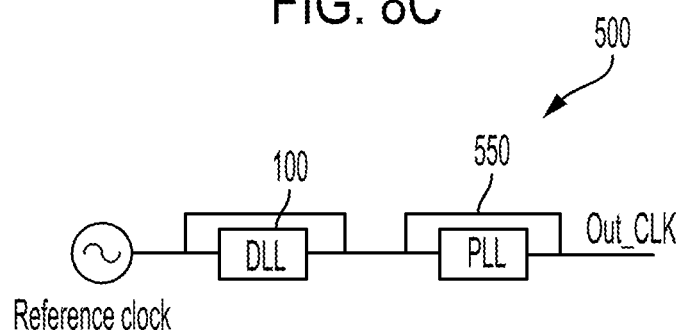
FIG. 9 is a schematic diagram of a phase locked-loop being coupled to the delay locked-loop of FIG. 2, in accordance with one embodiment of the present invention.

FIG. 9 is a simplified high-level block diagram of a frequency synthesizer or phase/frequency locking (control loop) circuit 500, in accordance with another exemplary embodiment of the present invention. Frequency synthesizer includes, in part, a DLL 100 as shown in FIG. 1 and described in detail above, and a phase-locked loop 550 that receives the output signal of DLL 100 and in response generates the output clock signal Out_CLK. PLL 550 is adapted to filter out the undesired frequency components of the signal that the PLL receives.

The above embodiments of the present invention are illustrative and not limitative. Embodiments of the present invention are not limited by the type of phase/frequency detector, charge pump, counter, filter, delay cell, and the like. Other additions, subtractions or modifications are obvious in view of the present disclosure and are intended to fall within the scope of the appended claims.

What is claimed is:

1. A retiming circuit comprising a delay locked-loop, said delay-locked-loop comprising:
   a phase/frequency detector responsive to a reference clock signal,
   a charge pump responsive to the phase/frequency detector;
   a variable delay line responsive to an output of the charge pump so as to cause a variable delay in the reference clock signal thereby to generate an internal clock signal; and
   a controlled delay line comprising a plurality of fixed delay cells, said controlled delay line causing the internal clock signal to be delayed by a delay across one of the plurality of fixed delay cells in response to the output of the charge pump, said controlled delay line generating an output clock signal of the delay-locked loop, wherein said delay locked-loop further comprises an overflow detector configured to cause a selection of one of the plurality of fixed delays in response to the output of the charge pump.

2. The retiming circuit of claim 1 wherein said variable delay line comprises a plurality of variable delay cells coupled in series, each of the plurality of variable delay cells receiving the output of the charge pump to change a delay across thereof.

3. The retiming circuit of claim 2 wherein each of the plurality of variable delay cells is a differential delay cell.

4. The retiming circuit of claim 3 wherein each variable delay cell is a differential delay cell comprising:
   first and second inverters coupled in series and providing a differentially high signal;
   third and fourth inverters coupled in series and providing a differentially low signal;
   a first capacitor having a first terminal coupled to an input terminal of the second inverter, and a second terminal coupled to the output of the charge pump; and
   a second capacitor having a first terminal coupled to an input terminal of the fourth inverter, and a second terminal coupled to the output of the charge pump.

5. The retiming circuit of claim 1 wherein each of said plurality of fixed delay cells is a differential delay cell supplying its output signal to a multiplexer.

6. The retiming circuit of claim 1 wherein said overflow detector comprises first and second comparators, said first comparator adapted to detect whether the output voltage of the charge pump is above a first threshold voltage, and said second comparator adapted to detect whether the output voltage of the charge pump is below a second threshold voltage.

7. The retiming circuit of claim 6 further comprising an up/down counter configured to be incremented if the first comparator detects that the output voltage of the charge pump is above the first threshold voltage, said up/down counter further configured to be decremented if the second comparator detects that the output voltage of the charge pump is below the second threshold voltage.

8. The retiming circuit of claim 7 wherein a clock terminal of the up/down counter is responsive to output signals of the first and second comparators.

9. The retiming circuit of claim 8 further comprising:
   an OR logic gate having a first input terminal receiving the output signal of the first comparator, and a second terminal receiving the output signal of the second comparator; and
   a delay element delaying an output signal of the OR logic gate to generate a second internal clock signal applied to a clock terminal of the up/down counter.

10. The retiming circuit of claim 9 wherein the up/down counter generates a select signal applied to a select input terminal of a multiplexer receiving the plurality of fixed delays of the controlled delay line.

11. The retiming circuit of claim 10 further comprising: a first reset circuit configured to reset the phase/frequency detector in response to the second internal clock signal.

12. The retiming circuit of claim 11 wherein said first rest circuit is further configured to reset the phase/frequency detector in response to a logical AND of the reference clock and the output clock signal.

13. The retiming circuit of claim 12 further comprising a divider configured to divide the logical AND of the reference clock and the output clock signal and generate a divided clock signal in response, said divider delivering the divided clock signal to a clock terminal of a flip-flop receiving the second internal clock signal at its data input terminal.

14. The retiming circuit of claim 13 further comprising:
   a second reset circuit configured to set the output voltage of the charge pump to a predefined voltage in response to an output of the flip-flop.

15. The retiming circuit of claim 14 further comprising: a first filter coupled to an output of the charge pump.

16. The retiming circuit of claim 15 wherein said filter is a capacitor.

17. The retiming circuit of claim 16 further comprising: a second filter coupled to an input terminal of the first and second comparators.

18. The retiming circuit of claim 17 further comprising:
   a voltage divider supplying a first reference voltage to the first comparator, and a second reference voltage to the second comparator.

19. The retiming circuit of claim 1 further comprising:
   a phase locked-loop adapted to receive the output clock signal of the delay-locked loop and generate a second output clock signal in response.

20. A method of retiming an output clock signal, the method comprising:
   detecting a difference between a phase/frequency of the output clock signal and a reference clock signal;
   increasing or decreasing a voltage in response to the detected difference;
   causing a variable delay in the reference clock signal thereby to generate an internal clock signal in response to the increase or decrease in the voltage;
   causing the internal clock signal to be delayed by a delay across one of a plurality of fixed delay cells in response to the increase or decrease in the voltage, thereby to generate the output clock signal,
   detecting whether the voltage is above a first threshold voltage to generate a first logic state; and
   detecting whether the voltage is below a second threshold voltage to generate a second logic state.

21. The method of claim 20 wherein each of said plurality of fixed delay cells is a differential delay cell supplying its output signal to a multiplexer.

22. The method of claim 20 wherein said variable delay is generated by a plurality of variable delay cells coupled in series.

23. The method of claim 22 wherein each of the plurality of variable delay cells is a differential delay cell.

24. The method of claim 20 further comprising:
   incrementing a counter if the voltage is above the first threshold voltage; and
   decrementing the counter if the voltage is below the second threshold voltage.

25. The method of claim 24 wherein a clock terminal of the counter is responsive to the detection.

26. The method of claim 25 further comprising:
   ORing the first and second logic states; and
   delaying an output of the OR function to generate a second internal clock signal applied to a clock terminal of the counter.

27. The method of claim 26 wherein the counter generates a select signal selecting one of the plurality of fixed delays.

28. The method of claim 27 further comprising:
   resetting a phase/frequency detector detecting the difference between the phase/frequency of the output clock signal and the reference clock signal in response to the second internal clock signal.

29. The method of claim 28 further comprising: setting the voltage to a predefined value.

\* \* \* \* \*